United States Patent
Yu et al.

(10) Patent No.: US 9,812,557 B2
(45) Date of Patent: Nov. 7, 2017

(54) METHOD OF MANUFACTURING SEMICONDUCTOR DEVICE

(71) Applicant: SAMSUNG ELECTRONICS CO., LTD., Suwon-Si, Gyeonggi-Do (KR)

(72) Inventors: Hyun-Kwan Yu, Suwon-si (KR); Dong-Suk Shin, Yongin-si (KR); Woon-Ki Shin, Seoul (KR); Cheol-Woo Park, Hwaseong-si (KR); Ryong Ha, Seoul (KR); Han-Jin Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/138,234

(22) Filed: Apr. 26, 2016

(65) Prior Publication Data

US 2016/0380082 A1 Dec. 29, 2016

(30) Foreign Application Priority Data

Jun. 26, 2015 (KR) .................. 10-2015-0091019

(51) Int. Cl.
| | |
|---|---|
| *H01L 21/28* | (2006.01) |
| *H01L 29/66* | (2006.01) |
| *H01L 21/3213* | (2006.01) |
| *H01L 21/02* | (2006.01) |
| *H01L 29/78* | (2006.01) |

(52) U.S. Cl.
CPC .. *H01L 29/66795* (2013.01); *H01L 21/02068* (2013.01); *H01L 21/32134* (2013.01); *H01L 29/66545* (2013.01); *H01L 29/7848* (2013.01)

(58) Field of Classification Search
CPC ......... H01L 21/28; H01L 29/66; H01L 29/08; H01L 21/302
See application file for complete search history.

(56) References Cited

U.S. PATENT DOCUMENTS

| | | | | |
|---|---|---|---|---|
| 6,054,343 | A * | 4/2000 | Ashburn | .......... H01L 21/76224 |
| | | | | 257/506 |
| 8,546,209 | B1 * | 10/2013 | Cheng | ................ H01L 29/6659 |
| | | | | 257/E21.434 |
| 8,735,991 | B2 | 5/2014 | Shieh et al. | |
| 8,871,597 | B2 | 10/2014 | Shieh et al. | |

(Continued)

FOREIGN PATENT DOCUMENTS

| | | |
|---|---|---|
| JP | 2014-022457 | 2/2014 |
| KR | 0587086 | 5/2006 |

(Continued)

*Primary Examiner* — Errol Fernandes
(74) *Attorney, Agent, or Firm* — Volentine & Whitt, PLLC

(57) ABSTRACT

A method of manufacturing a semiconductor device includes forming an active fin extending longitudinally in a first direction along a surface of a substrate, forming a field insulating layer on the substrate, the field insulating layer covering a part of the active fin, forming a dummy gate electrode on the field insulating layer and the active fin, the dummy gate electrode extending in a second direction different from the first direction, forming a spacer on the sides of the dummy gate electrode, and removing the dummy gate electrode by a wet etching process that includes rinsing the dummy gate electrode intermittently during an etching away of the dummy gate electrode.

19 Claims, 29 Drawing Sheets

(56) References Cited

U.S. PATENT DOCUMENTS

| | | | |
|---|---|---|---|
| 2009/0315120 A1 | 12/2009 | Shifren et al. | |
| 2010/0124823 A1* | 5/2010 | Yeh | H01L 21/02071 |
| | | | 438/753 |
| 2011/0151655 A1* | 6/2011 | Chan | H01L 21/28079 |
| | | | 438/589 |
| 2014/0273528 A1 | 9/2014 | Niskanen et al. | |
| 2014/0374827 A1 | 12/2014 | Suh et al. | |
| 2015/0021710 A1 | 1/2015 | Hsu et al. | |
| 2015/0340471 A1* | 11/2015 | Lim | H01L 29/66795 |
| | | | 438/283 |

FOREIGN PATENT DOCUMENTS

| | | |
|---|---|---|
| KR | 2006-0075402 | 7/2006 |
| KR | 2011-0132753 | 12/2011 |
| KR | 1435710 | 8/2014 |
| KR | 2015-0000546 | 1/2015 |

\* cited by examiner

1200

1400

METHOD OF MANUFACTURING SEMICONDUCTOR DEVICE

This application claims priority from Korean Patent Application No. 10-2015-0091019 filed on Jun. 26, 2015 in the Korean Intellectual Property Office, and all the benefits accruing therefrom under 35 U.S.C. 119, the contents of which are hereby incorporated by reference in their entirety.

BACKGROUND

1. Field

The present inventive concept relates to a method of manufacturing a semiconductor device. In particular, the inventive concept relates to processes for forming a metal gate of a semiconductor device such as gate last or replacement gate processes.

2. Description of the Related Art

Gate electrodes of transistors of semiconductor devices have conventionally been made of polysilicon. However, polysilicon gate electrodes have now been replaced with metal gate electrodes in order to satisfy performance requirements. A gate last process or a replacement gate process is an example of one process for realizing a metal gate.

SUMMARY

According to the present inventive concept, there is provided a method of manufacturing a semiconductor device comprising forming an active fin extending longitudinally along a surface of a substrate in a first direction, forming a field insulating layer on the substrate, the field insulating layer covering a part of the active fin, forming a dummy gate structure comprising a dummy gate electrode on the field insulating layer and the active fin, the dummy gate electrode extending longitudinally in a second direction different from the first direction, forming a spacer on sides of the dummy gate electrode, and removing the dummy gate electrode by performing a wet etching process including a primary etch process of etching away a first thickness of the dummy gate electrode using an etchant, rinsing the dummy gate electrode using a rinse solution after the primary etching process, and a secondary etch process of etching away a second thickness of the dummy gate electrode using an etchant after the rinsing.

According to the present inventive concept, there is also provided a method of manufacturing a semiconductor device comprising forming an active fin extending longitudinally along a surface of a substrate in a first direction, forming a field insulating layer on the substrate, the field insulating layer covering a part of the active fin, forming a dummy gate structure comprising a dummy gate electrode on the field insulating layer and the active fin, the dummy gate electrode extending longitudinally in a second direction different from the first direction, forming a spacer on sides of the dummy gate electrode, forming a source and drain on the active fin, and removing the dummy gate electrode, and in which the removing of the dummy gate electrode comprises predetermining a value based on at least one thickness of the gate spacer in the first direction, and etching away thicknesses of the dummy gate electrode with wet etchant in a series of discrete etches, respectively, a first of the thicknesses being substantially equal to between 1 and 6.5 times said value.

According to the present inventive concept, there is also provided a method of manufacturing a semiconductor device comprising forming a field insulating layer on a surface of a substrate, and forming at least one active fin, the field insulating layer covering a lower part of each said at least one active fin, forming a dummy gate structure comprising a dummy gate electrode on the field insulating layer and extending across an upper part of each said at least one active fin, forming a spacer on sides of the dummy gate electrode such that the spacer also extends across the an upper part of each said at least one active fin, subsequently etching away the dummy gate electrode using at least one wet etchant such that a trench is formed in a region vacated by the dummy gate electrode, and rinsing a remaining portion of the dummy gate electrode with a rinsing solution that does not etch the material of the dummy gate electrode after each time at least one portion of the dummy gate electrode has been etched away to thereby also rinse sides of the spacer facing the dummy gate electrode with the rinsing solution, and forming a gate electrode in the trench.

BRIEF DESCRIPTION OF THE DRAWINGS

The above and other aspects and features of the present inventive concept will become more apparent from the following detail description of examples thereof with reference to the attached drawings, in which:

FIGS. 1 to 13 illustrate an example of a method of manufacturing a semiconductor device according to the present inventive concept, and in which FIGS. 1-5, 7, 8. 12 and 13 are each a perspective view of the device during the course of its manufacture, FIG. 11 is a timing chart;

FIGS. 14, 15 and 16 illustrate another example of a method of manufacturing a semiconductor device according to the present inventive concept, and in which FIGS. 14 and 15 are each a perspective view of the device during the course of its manufacture and FIG. 16 is a cross-sectional view taken along line D-D' of FIG. 15;

DETAILED DESCRIPTION

Figure 1:
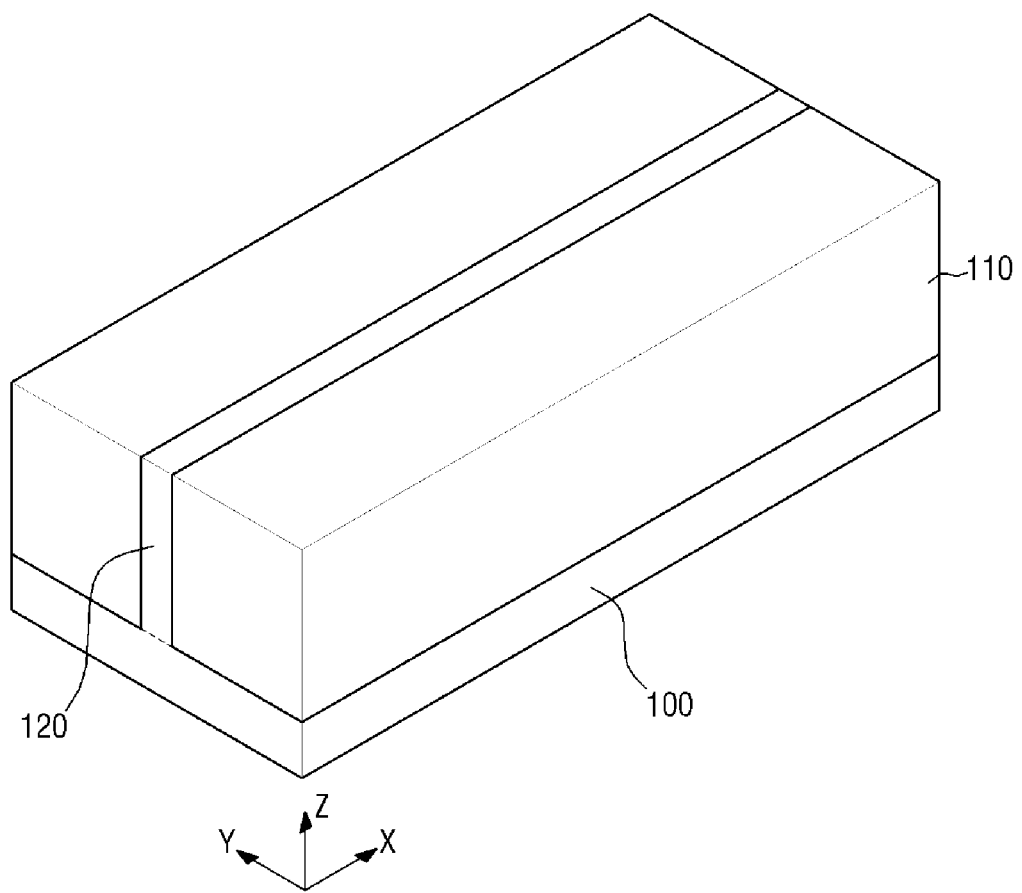

Advantages and features of the present inventive concept may be understood more readily by reference to the following detailed description of preferred examples and the accompanying drawings. The present inventive concept may, however, be embodied in many different forms and should not be construed as being limited to the examples set forth herein. Rather, these examples are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples only and is not intended to be limiting of the inventive concept. The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views and/or cross-sectional views, in which preferred examples of the inventive concept are shown. Thus, the profile of an exemplary view may be modified according to manufacturing techniques and/or allowances. That is, the examples of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. For example, it will be appreciated that numerical values or range of values of a particular process parameter refer to the desired value(s) under the control of the particular process and that the term "about" or "substantially" as used in connection with such numerical values encompasses slight variations of the numerical value(s) from those desired under the control of the process due to typical variations inherent in the process. Accordingly, all descriptions of a process parameter preceded by the term "about" or "substantially" may be inclusive of the stated value(s) of the process parameter. Furthermore, unless defined otherwise, all terms defined in generally used dictionaries may not be overly interpreted.

Hereinafter, a method of manufacturing a semiconductor device according to examples of the present inventive concept will be described with reference to FIGS. 1 to 13.

Referring to FIG. 1, an active fin 120 is formed on a substrate 100.

The substrate 100 may be a bulk silicon or silicon-on-insulator (SOI) substrate. Alternatively, the substrate 100 may comprise silicon-germanium, indium antimonide, lead telluride, indium arsenide, indium phosphide, gallium arsenide, or gallium antimonide.

The substrate 100 may be an epitaxial layer formed on a base plate. In this case, the epitaxial layer may contain silicon or germanium, i.e., a semiconductor material. For example, the epitaxial layer may contain a group IV-IV compound semiconductor or a group III-V compound semiconductor. Group IV-IV compound semiconductors may be binary or ternary compounds containing at least two of carbon (C), silicon (Si), germanium (Ge), and tin (Sn). In addition, the binary compound or ternary compound may be doped with a group IV element. Group III-V compound semiconductors may be a binary compound, a ternary compound, or a quaternary compound, each of which is formed by bonding at least one group III element of aluminum (Al), gallium (Ga), and indium (In) with at least one group V element of phosphorus (P), arsenic (As), and antimony (Sb).

In the detailed description of the present inventive concept that follows, however, examples in which the substrate 100 is a silicon substrate will be described for the sake of simplicity.

Next, a dummy spacer may be formed on the substrate 100. In this case, the substrate 100 is etched using the dummy spacer, thereby forming the active fin 120. That is, the active fin 120 may be formed through a mandrel process, but the inventive concept is not limited thereto. The active fin 120 may extend longitudinally in a first direction (X). It is shown in FIG. 1 that each side of the active fin 120 has a vertical slope, but the inventive concept is not limited thereto. That is, the sides of the active fin 120 may instead be inclined such that, for example, the active fin 120 may taper upwardly.

Also, as a result of the etching process, a recess in the substrate is formed around the active fin 120. Subsequently, a field insulating layer 110 filling the recess is formed around the active fin 120. The field insulating layer 110 may be made of at least one a material selected from the group consisting of silicon oxide, silicon nitride, and silicon oxynitride.

Subsequently, the field insulating layer 110 may be planarized. Through the planarization process, the upper surface of the active fin 120 and the upper surface of the field insulating layer 110 may be made coplanar.

Figure 2:
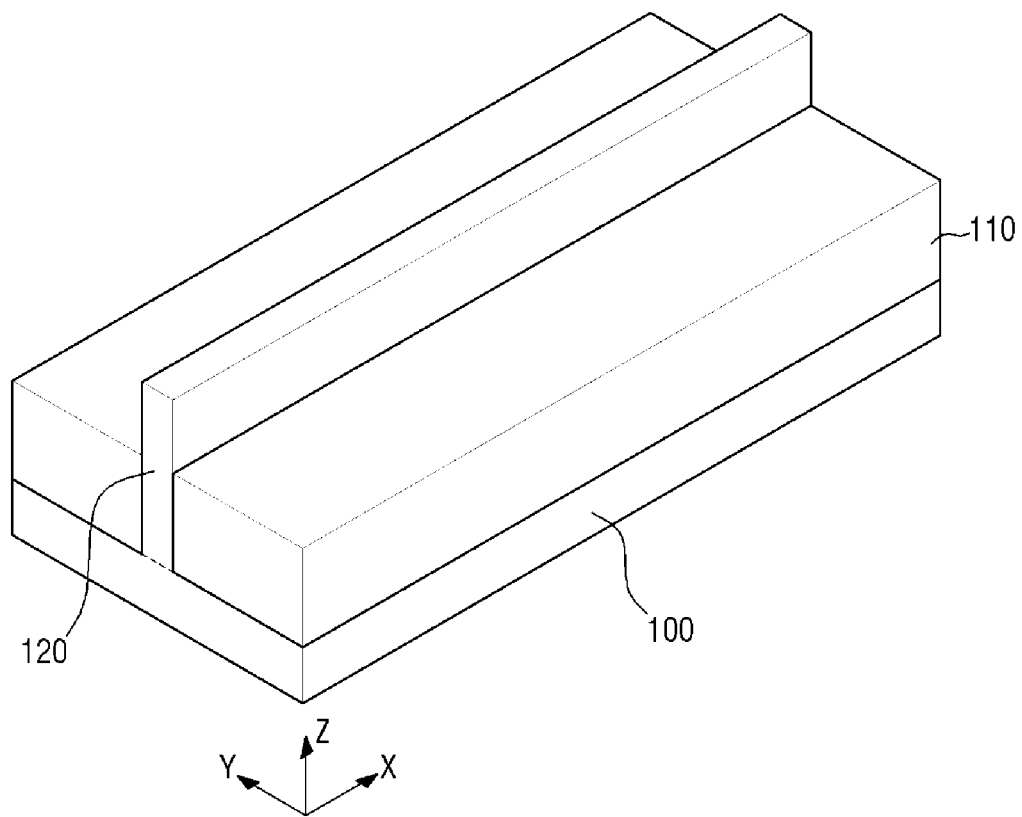

Referring to FIG. 2, the upper portion of the field insulating layer 110 is removed to expose an upper portion of the active fin 120. The removal process may be a selective etching process. Alternatively, after the upper surface of the active fin 120 is exposed the upper portion of the active fin 120 may be grown, so as to protrude above the field insulating layer 110, using the exposed portion of the fin as a seed layer in an epitaxial growth process.

In some examples of the present inventive concept, the active fin 120 may be subject to a doping process for adjusting a threshold voltage. When the transistor formed using the active fin 120 is an NMOS transistor, the active fin 120 may be doped with impurities such as boron (B). When the transistor formed using the active fin 120 is a PMOS transistor, the active fin 120 may be doped with impurities such as phosphorus (P) or arsenic (As).

Figure 3:
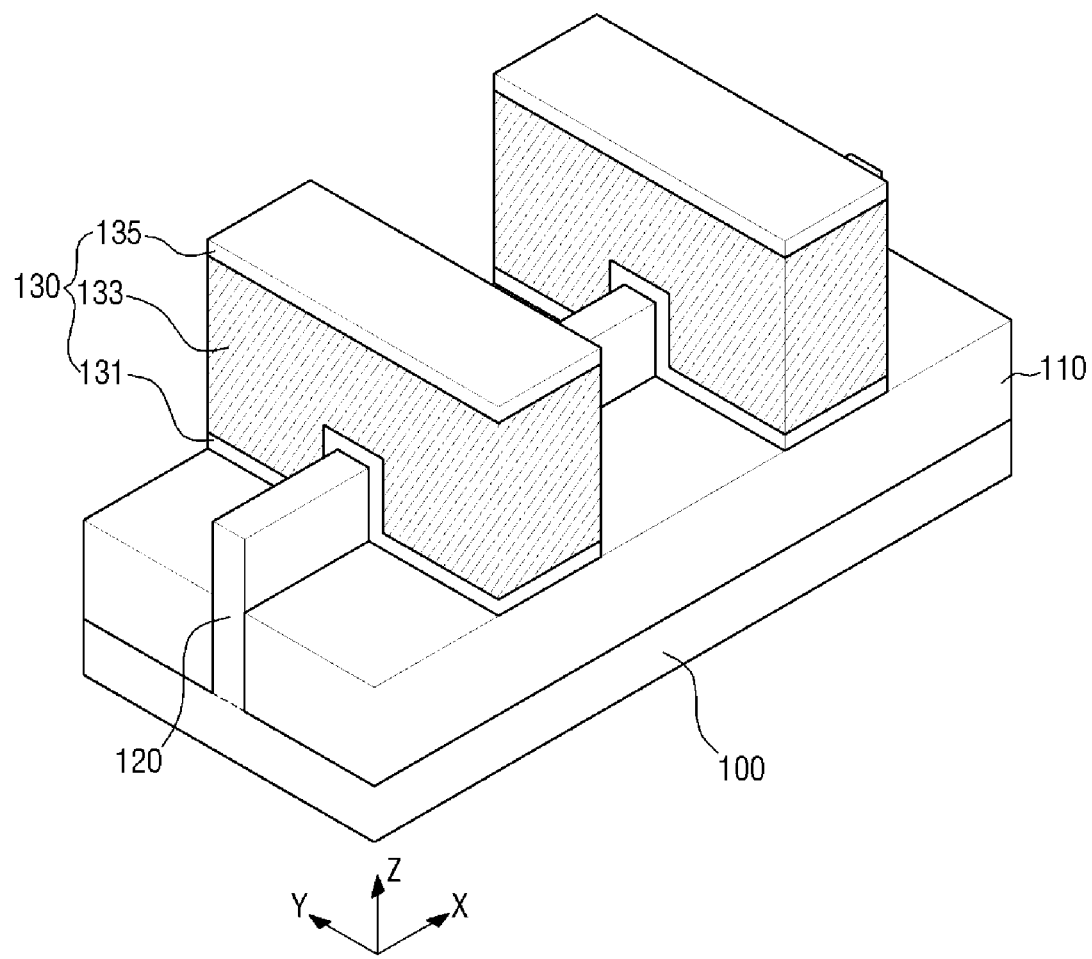

Referring to FIG. 3, a dummy gate structure(s) 130 intersecting the active fin 120 is formed on the active fin 120. The dummy gate structure 130 may be formed to extend longitudinally in a second direction (Y).

The dummy gate structure 130 may include a dummy silicon oxide layer 131, a dummy gate electrode 133, and a hard mask 135, which are sequentially stacked. That is, the dummy gate structure 130 is a stack of a dummy silicon oxide layer 131, a dummy gate electrode 133, and a hard mask 135, which extend in the second direction (Y).

Such a dummy gate structure 130 may be formed by using the hard mask 135 as an etching mask.

FIG. 3 shows that the dummy silicon oxide layer 131 is formed on the upper surface of the field insulating layer 110 as well as on the periphery of the active fin 120, but the inventive concept is not limited thereto. That is, the dummy silicon oxide layer 131 may be formed only on the side surfaces and upper surface of the active fin 120 protruding above the field insulating layer 110.

Furthermore, FIG. 3 shows that the dummy silicon oxide layer 131 is formed only on that part of the active fin 120 overlapped by the dummy gate structure 130, but the inventive concept is not limited thereto. That is, the dummy silicon oxide layer 131 may also be formed on the entirety of the side surfaces and upper surface of the active fin 120 which protrude above the field insulating layer 110.

The dummy silicon layer 131 can serve to protect the active fin 120, used as a channel region, during the subsequent processes.

The dummy gate electrode 133 may be formed on the dummy silicon oxide layer 131. In an example of the method of manufacturing a semiconductor device according to the present inventive concept, the dummy gate electrode 133 is made of polysilicon.

The dummy gate electrode 133 may entirely cover the active fin 120 overlapping the dummy gate structure 130 and protruding above the field insulating layer 110. In other words, the height as measured from the upper surface of the field insulating layer 110 to the upper surface of the active fin 120 is lower than the height as measured from the upper surface of the field insulating layer 110 to the upper surface of the dummy gate electrode 133.

The dummy gate electrode 133 and the dummy silicon oxide layer 131 may have high etching selectivity. The dummy gate electrode 133 may be etched to form a replacement metal gate. In this case, the dummy gate electrode 133 is removed, but the dummy silicon oxide layer 131 remains. For this reason, the active fin 120 disposed beneath the silicon oxide layer 131 can be protected.

The hard mask 135 may be formed on the dummy gate electrode 133. The hard mask 135 may comprise silicon nitride (SiN), but the inventive concept is not limited thereto.

Figure 4:
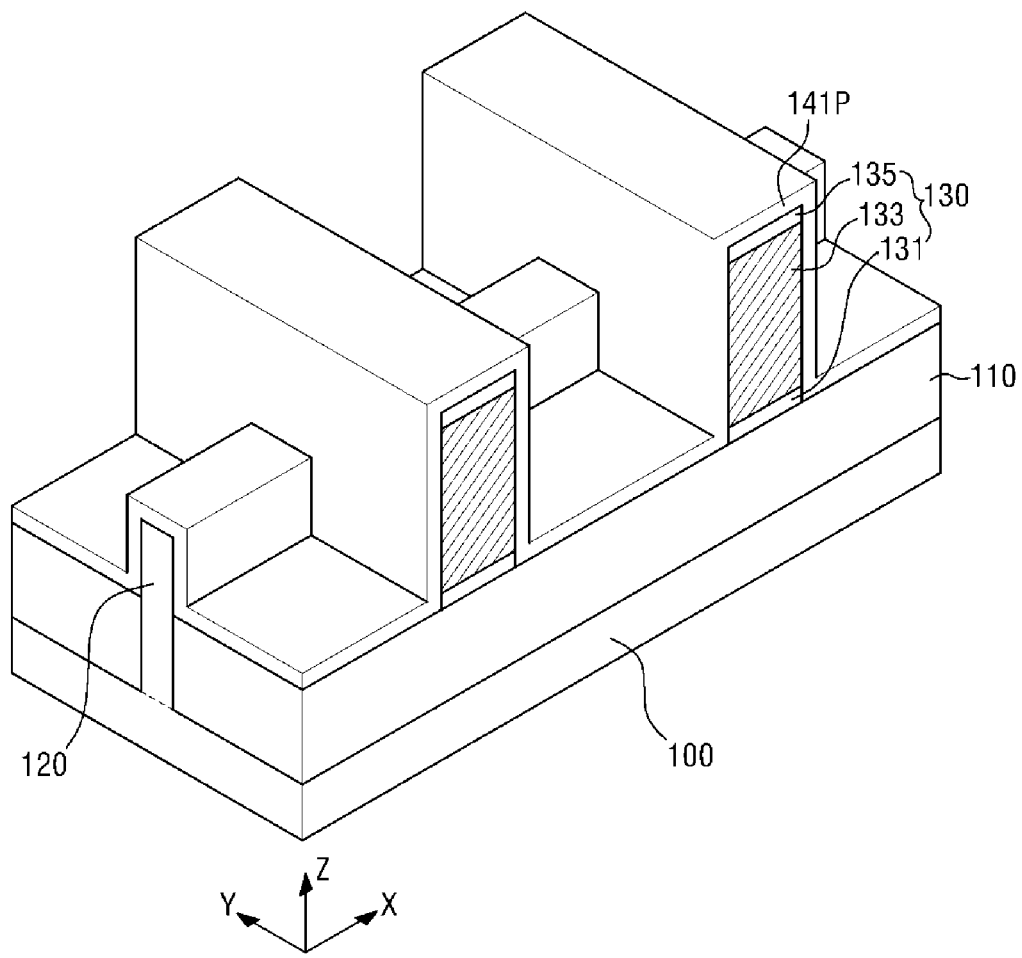

Referring to FIG. 4, a gate spacer layer 141p covering the active fin 120 and the dummy gate structure 130 is formed.

The gate spacer layer 141p may be conformally formed so as to extend along the side surfaces and upper surface of the dummy gate structure 130, the side surfaces and upper surface of the active fin 120, and the upper surface of the field insulating layer 110.

The gate spacer layer 141p may comprise at least one material selected from the group consisting of silicon nitride (SiN), silicon oxynitride (SiON), silicon oxide ($SiO_2$), silicon oxycarbonitride (SiOCN), and silicon carbonitride (SiCN). The gate spacer layer 141p may be formed by chemical vapor deposition (CVD), atomic layer deposition (ALD), or the like.

Figure 5:
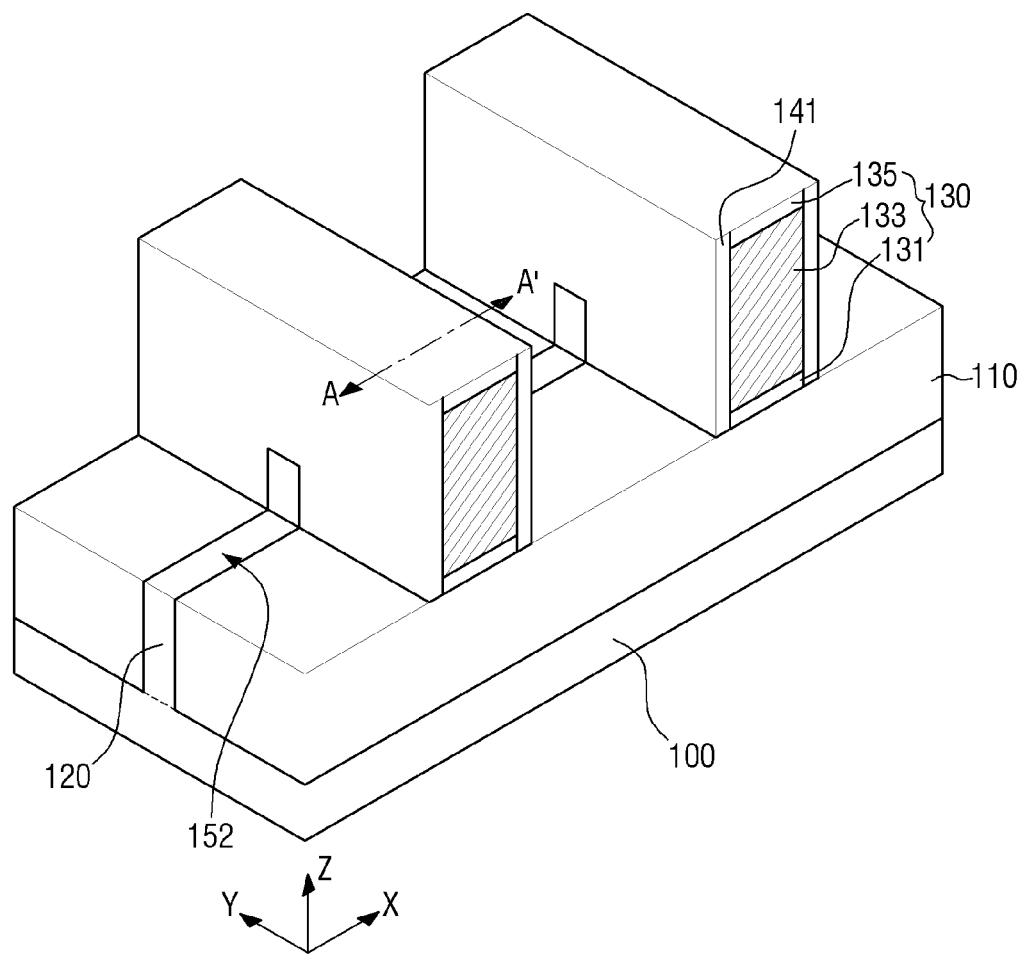

Referring to FIG. 5, a trench 152 may be formed at the sides of the dummy gate structure 130. Specifically, the trench 152 may be formed in the active fin 120 at the sides of the dummy gate structure 130. As a result, a gate spacer 141 may be formed from the gate spacer layer 141p. That is, the gate spacer 141 may be formed when the trench 152 is formed. The gate spacer 141 is formed on the sides of the dummy gate structure 130, and may also be formed on sides of the active fin 120 not overlapped by the dummy gate structure 130.

To form the trench 152 in the active fin 120, portions of the gate spacer layer 141p on the sides of the active fin 120 must be removed. As a result, the gate spacer layer 141p is removed from the upper surface of the dummy gate structure 130 and part of the hard mask 135 may also be removed.

Examples of the resulting the gate spacer 141 will be described with reference to FIGS. 6A and 6B.

Figure 6A:
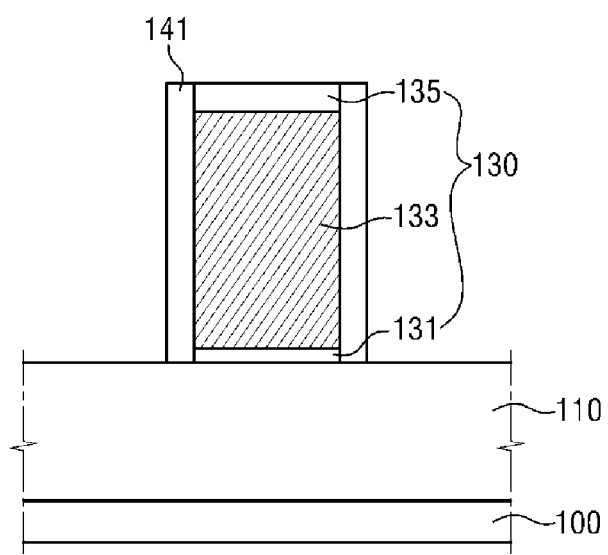
FIGS. 6A and 6B are cross-sectional views taken along line A-A' of FIG. 5.

In the example shown in FIG. 6A, the gate spacer 141 is a single layer formed on the sides of the dummy gate structure 130.

Figure 6B:
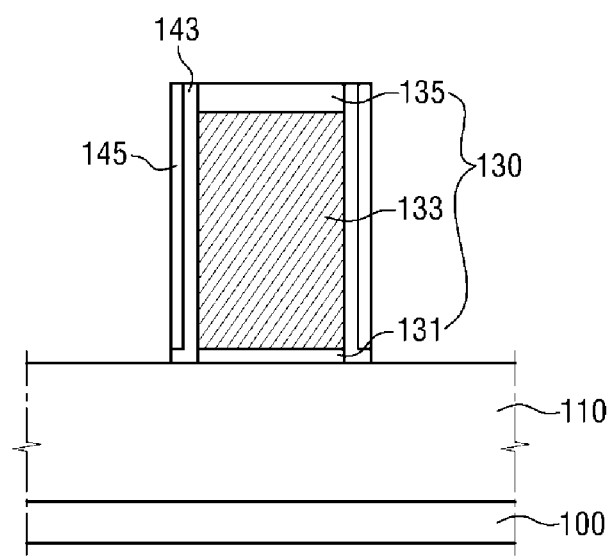

In the example shown in FIG. 6B, the gate spacer 141 has a multi-layered structure. FIG. 6B shows a double layer structure as an example.

Referring to FIG. 6B, the gate spacer 141 may include a first spacer layer 143 and a second spacer layer 145.

The first spacer layer 143 may contact the dummy gate electrode 133. However, the inventive concept is not limited thereto, and another layer may be formed first so as to be interposed between the first spacer layer 143 and the dummy gate electrode 133. In any case, the first spacer layer 143 may be located closer to the dummy gate electrode 133 than the second spacer layer 145.

The first spacer 143 and the second spacer layer 145 may be of respective materials having different dielectric constants from each other.

The first spacer layer 143 and second spacer layer 145 may have different etching rates. For example, in a wet etching process, the etching rate of the first spacer layer 143 to an etchant containing ammonia may be higher than that of the second spacer layer 145. Therefore, at the time of a wet etching process for removing the dummy gate electrode 133, which will be described later, the first spacer 143 may be vulnerable to the etchant, compared to the second spacer 145.

In another example (not shown), the first spacer layer 143 has an I-shaped vertical cross-sectional shape.

Figure 7:
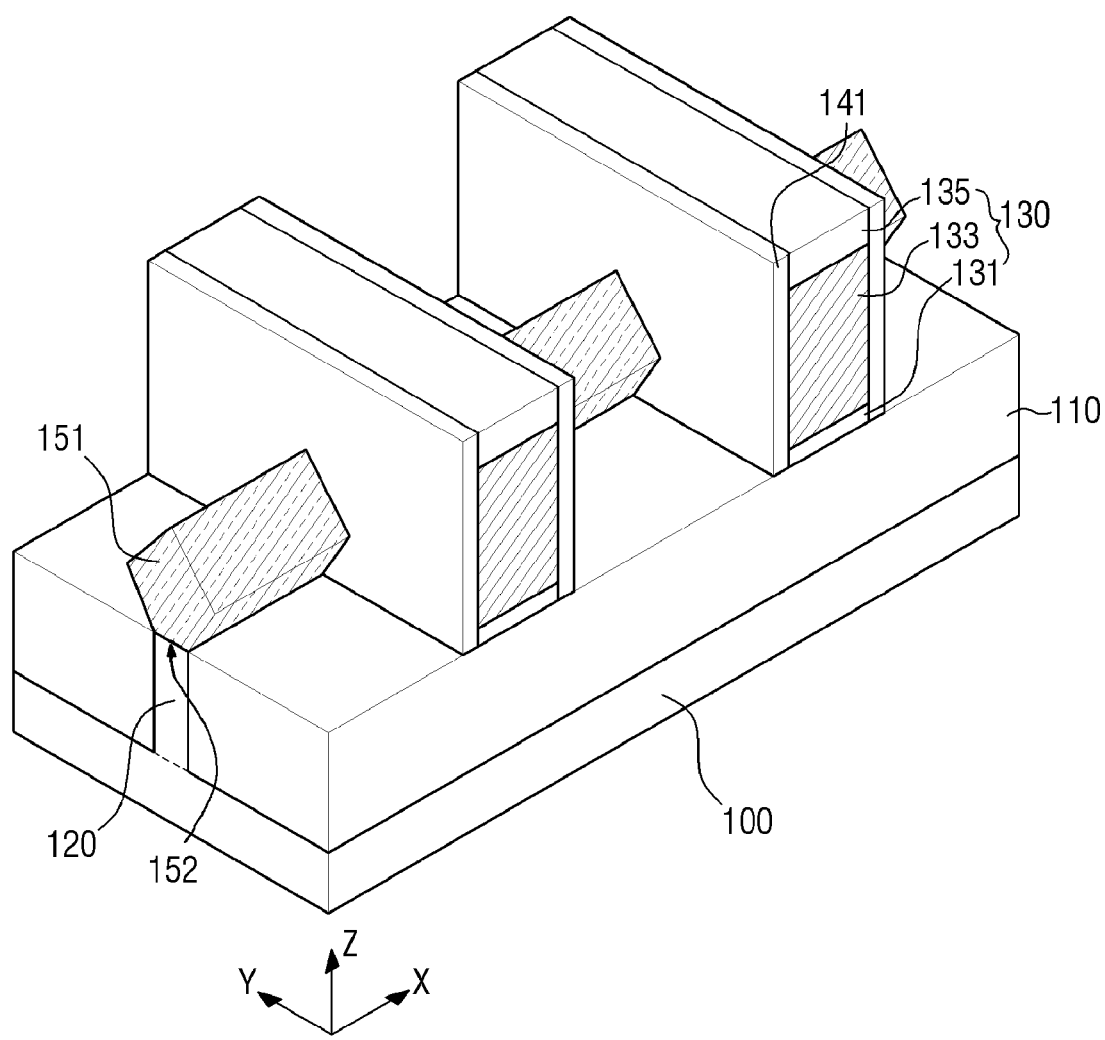

Referring to FIG. 7, a semiconductor pattern 151 may be formed in the trench 152 by an epitaxial growth process. The semiconductor pattern 151 formed in the trench 152 may be disposed on the sides of the dummy gate structure 130. The semiconductor pattern 151 may serve as the source and drain of a transistor, i.e., may constitute an elevated source and drain.

When the transistor formed using the active fin 120 is a PMOS transistor, the semiconductor pattern 151 may contain a compressive stress material. The compressive stress material may be a material having a lattice constant greater than that of silicon (Si) such as SiGe. The compressive stress material can improve the mobility of a carrier in a channel region by applying compressive stress to the active fin 120.

When the transistor formed using the active fin 120 is an NMOS transistor, the semiconductor pattern 151 may be made of a material constituting the substrate 100 or a tensile stress material. For example, when the substrate 100 is made of silicon (Si), the semiconductor pattern 151 may be made of silicon (Si) or a material having a lattice constant less than that of silicon (Si) (for example, SiC).

If necessary, the semiconductor pattern 151 may be doped in-situ with impurities during the epitaxial growth process for forming the semiconductor pattern 151.

The semiconductor pattern 151 may have any of various vertical cross-sectional shapes such as that of or resembling a diamond, circle, or rectangle. In FIG. 7, a pentagonal shape is shown as an example of a shape resembling a diamond shape, but the inventive concept is not limited thereto and the vertical cross section of the semiconductor pattern 151 may have instead other shapes resembling that of diamond such as a hexagon.

Figure 8:
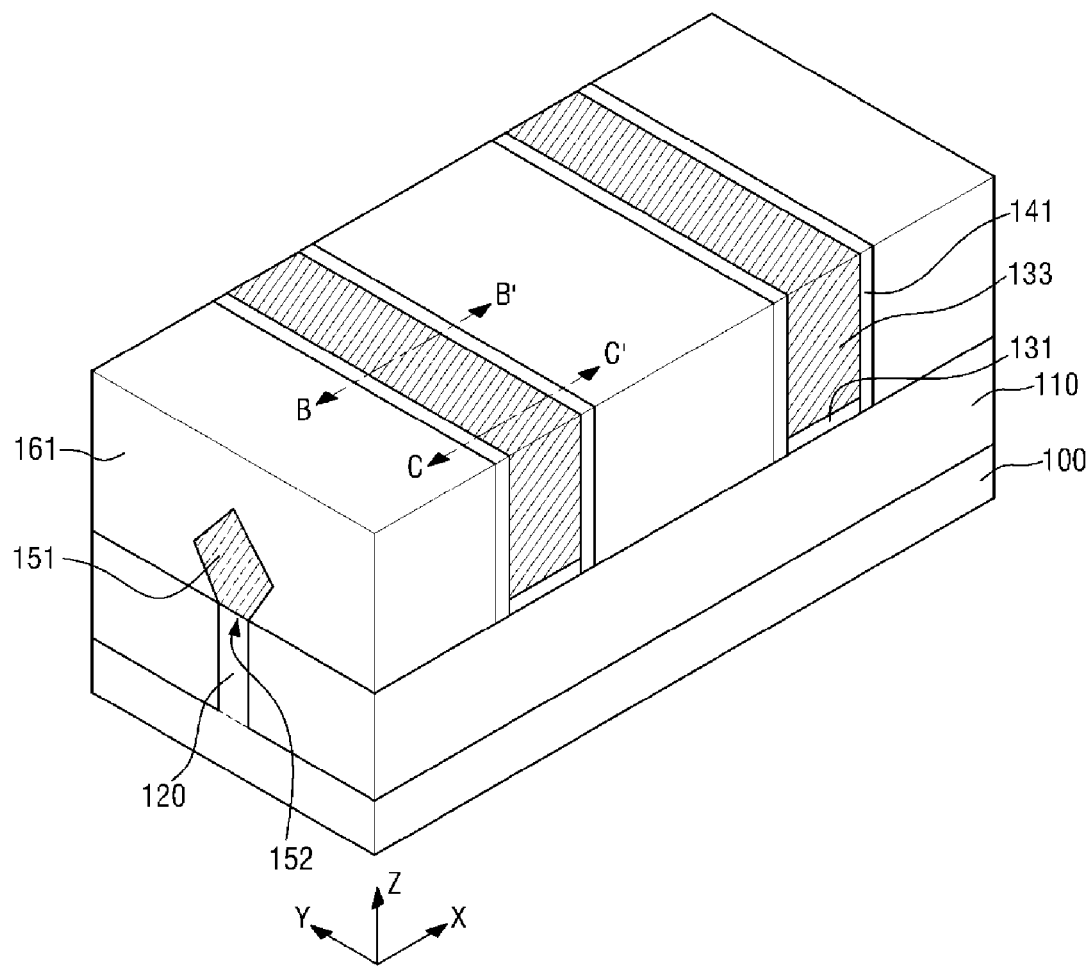
Figure 9A:
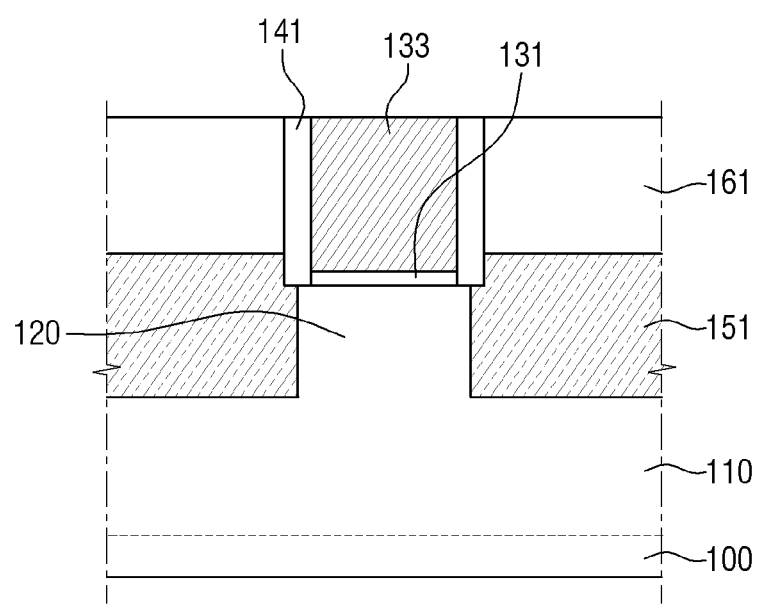
FIG. 9A is a cross-sectional view taken along the line B-B' of FIG. 8, FIGS. 9B, 10A, 10B and 10C are cross-sectional views taken along the line C-C' of FIG. 8.
Figure 9B:
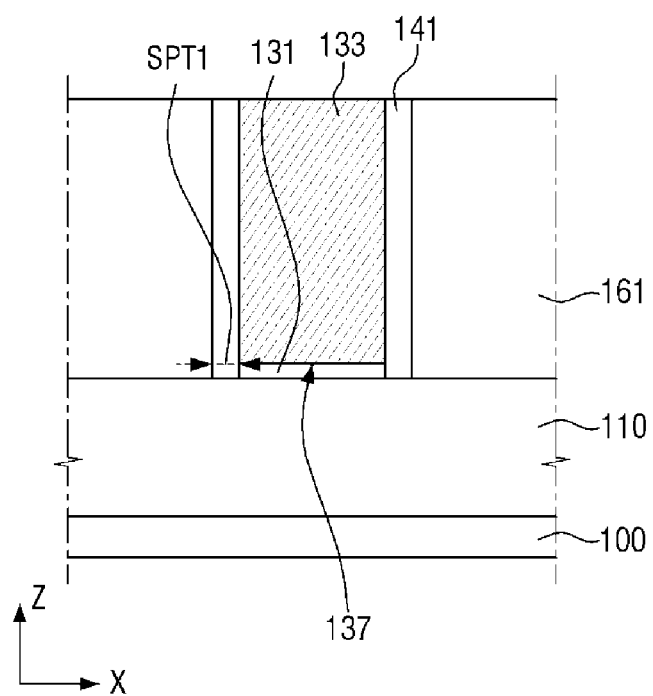

Referring to FIGS. 8 to 9B, an interlayer insulating film 161 covering the semiconductor pattern 151 and sides of the dummy gate structure 130 is formed on the field insulating layer 110.

The interlayer insulating film 161 may include at least one of a low dielectric material, an oxide film, a nitride film, and an oxynitride film. Examples of the low dielectric material include, but are not limited to, FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), and combinations thereof.

The interlayer insulating film 161 may be formed by forming a blanket layer of insulating material on the semiconductor pattern 151 and dummy gate structure 130 and planarizing the blanket layer until the upper surface of the hard mask 135 or dummy gate electrode 133 is exposed. In the latter case, the hard mask 135 is removed.

Next, the dummy silicon oxide layer 131 and the dummy gate electrode 133 are removed. Here, the removal of the dummy gate electrode 133 may be performed by a wet etching process. In the wet etching process, the dummy gate electrode 133 can be removed without removing the gate spacer 141. The wet etching process will be described in more detail below.

Figure 10A:
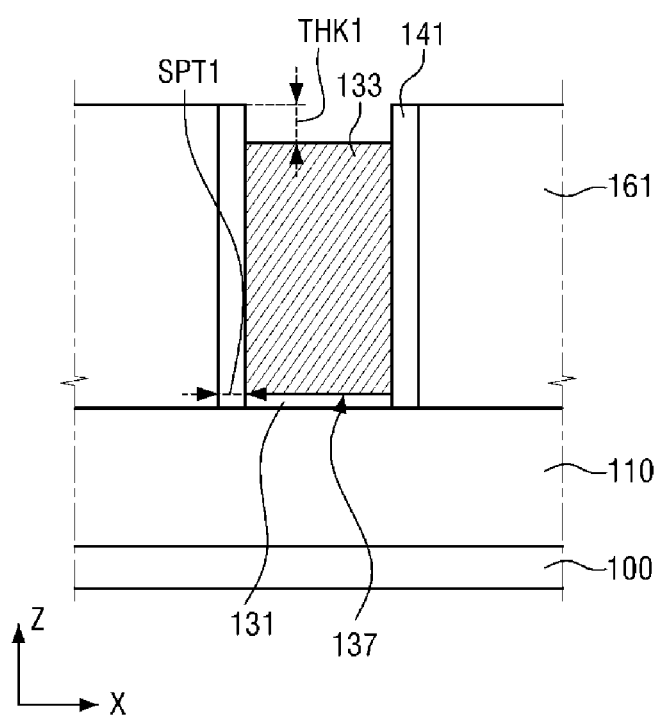
Figure 11:
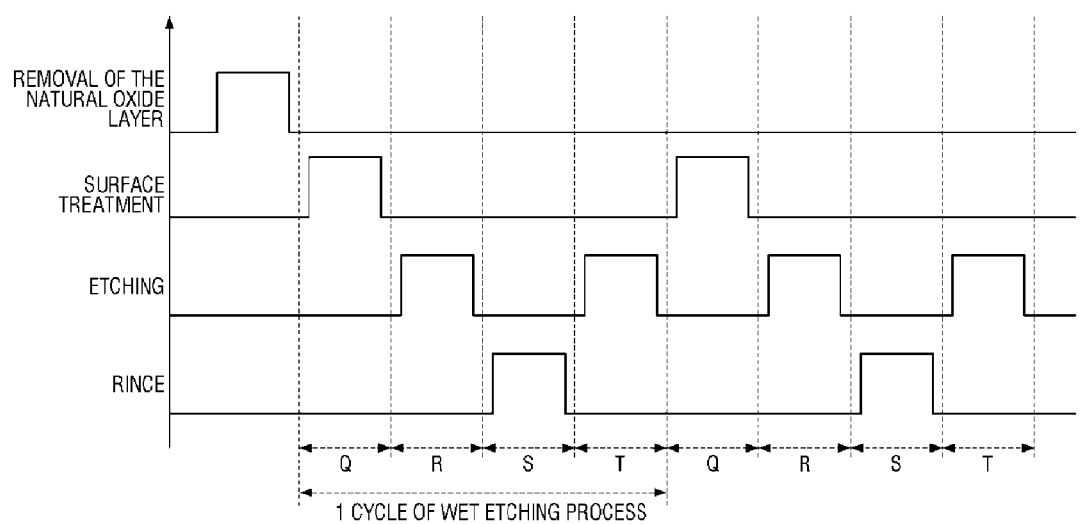

Referring to FIGS. 10A and 11, a natural oxide layer formed on the upper surface of the exposed dummy gate electrode 133 is removed.

The removal of the natural oxide layer may be performed using hydrofluoric acid (HF), but the inventive concept is not limited thereto.

Subsequently, the dummy gate electrode 133 is removed by sequentially performing a Q portion, R portion and S portion of the wet etching process.

The Q portion of the wet etching process refers to a surface treatment portion of the process. In the Q portion, the surface of the dummy gate electrode 133, from which the natural oxide layer has been removed, is surface-treated using a cleaning solution. The surface of the dummy gate electrode 133 may be hydrophilically treated such that the surface thereof reacts (more) easily with chemicals used in the subsequent process.

The R portion of the wet etching process refers to a portion of the process in which a first part of the dummy gate electrode 133 is removed by a wet etchant. The etchant may be a solution of ammonia, but the inventive concept is not limited thereto.

In this case, the thickness of the dummy gate electrode 133 that may be removed is THK1. THK1 is a multiple of the gate spacer thickness (SPT1). In examples of this method, THK1 is about 1 to about 6.5 times the gate spacer thickness (SPT1). The gate spacer thickness (SPT1) may be the thickness of the gate spacer 141 in the first direction (X) taken at a boundary or interface 137 between the dummy gate electrode 133 and the dummy silicon oxide layer 131.

While the R portion of the wet etching process proceeds, some of the etchant may permeate the gate spacer 141.

FIG. 10A shows the state just prior to the S portion of the wet etching process.

The S portion of the wet etching process may comprise rinsing the structure with a rinse solution. As a result of the rinsing process, at least some of the etchant that has permeated into the gate spacer 141 is removed. The rinse solution may be deionized water (DI), but is not limited thereto.

Figure 10B:
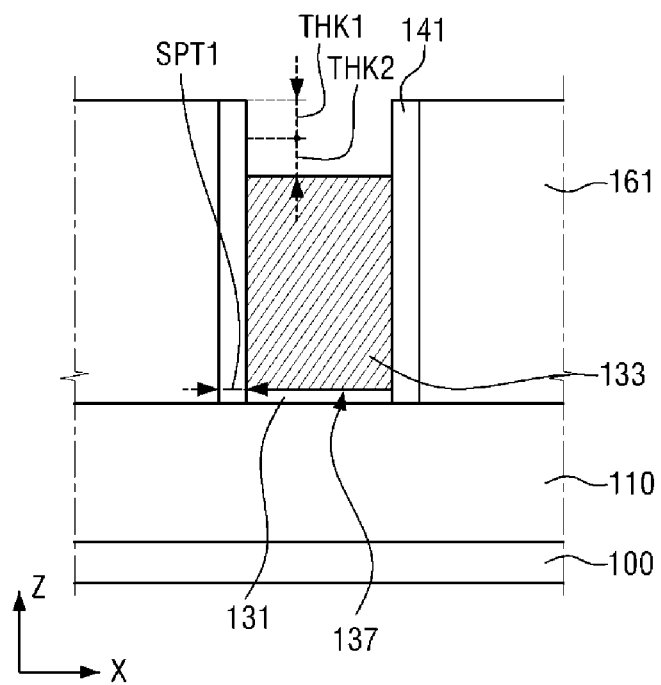

Referring to FIGS. 10B and 11, a part of the dummy gate electrode 133 is removed by the T portion of the wet etching process. For reference, FIG. 10B shows the state just prior to the T portion of the wet etching process.

In the T portion of the wet etching process, the dummy gate electrode 133 is secondarily etched. The secondary etching may be a wet etching process using an etchant. The etchant may the same as the etchant in the primary etching (R portion of the process), but the inventive concept is not limited thereto.

In this case, the dummy gate electrode 133 is further etched by THK2. THK2 is also a multiple tied to gate spacer thickness (SPT1). In examples of this method, THK2 is about 1 to about 6.5 times the gate spacer thickness (SPT1).

As described above, in the method according to the inventive concept, the wet etching process may include a native oxide removal process (Q), a primary etching process (R), a secondary etching process (T), and a rinsing process (S) between the primary etching and the secondary etching processes. The Q to T portions may be one cycle of a wet etching process in a method according to the inventive concept.

Figure 10C:
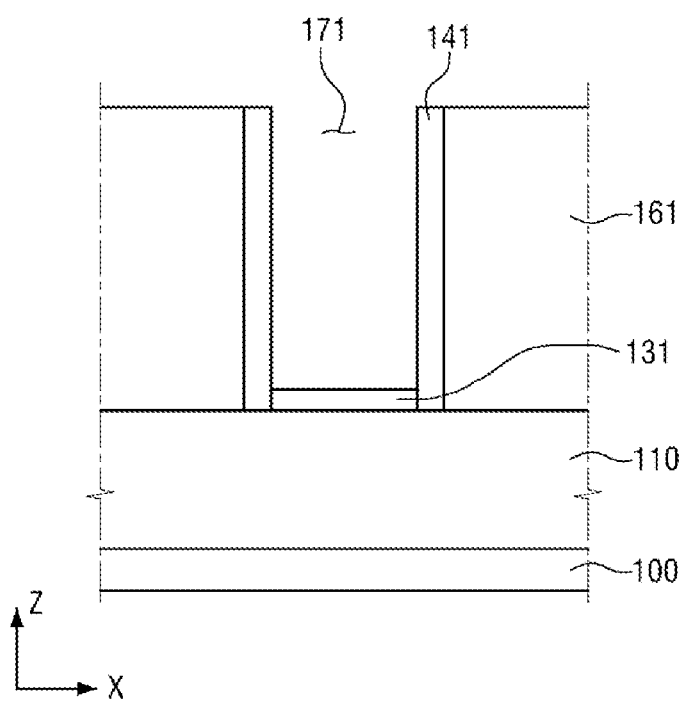

That is, as shown in FIG. 10B, the dummy gate electrode 133 may not be completely removed after one cycle of the wet etching process has been completed. Therefore, the dummy gate electrode 133 can be completely removed by performing several cycles of the wet etching process, as shown in FIGS. 10C and 11. In this way, an excessive amount of etchant will not remain in the gate spacer 141, which etchant could otherwise create a defect in the spacer.

The cycle or cycles of the wet etch process are carried out until the dummy gate electrode 133 is completely removed to expose the dummy silicon oxide layer 131 on the field insulating layer 110.

Figure 12:
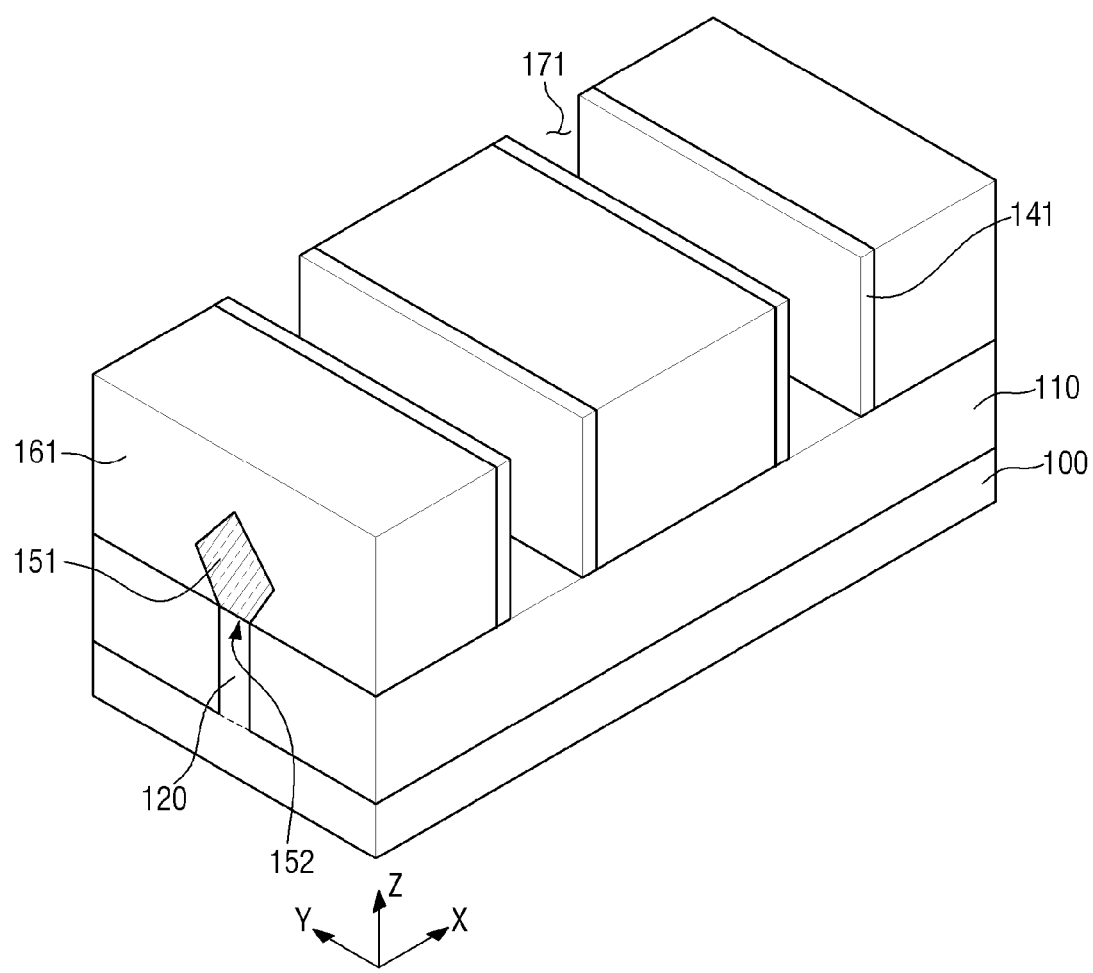

Referring to FIG. 12, the dummy silicon oxide layer 131 may then be removed.

A trench 171 may be formed by the removing of the dummy silicon oxide layer 131 and the dummy gate electrode 133.

Figure 13:
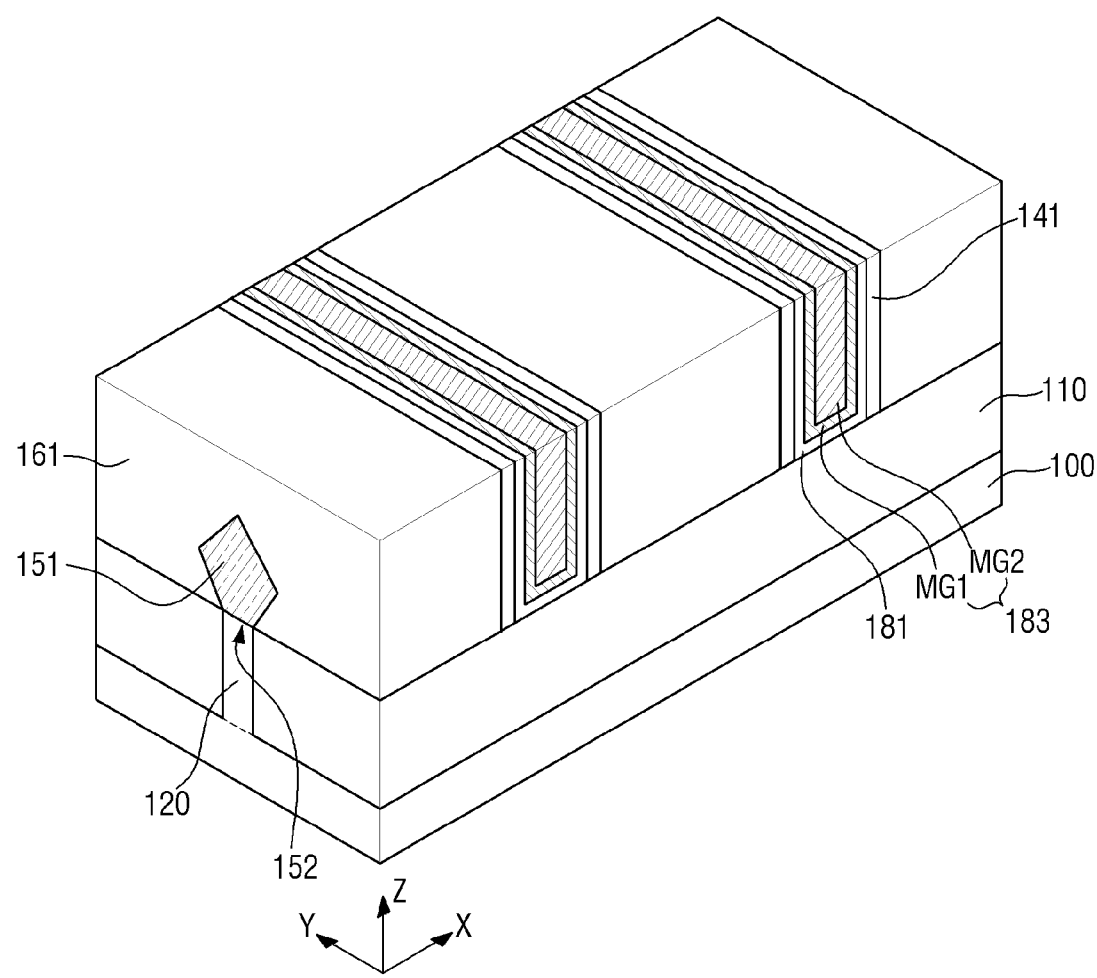

Referring to FIG. 13, a gate insulating layer 181 and a replacement gate electrode 183 may be formed in the trench 171.

The gate insulating layer 181 may extend in a third direction (Z) along side surfaces of the gate spacer 141, and on the top surface and side surfaces of the active fin above the upper surface of the field insulating layer 110.

The gate electrode 183 may include metal layers MG1 and MG2. The gate electrode 183 may be a stack of two or more metal layers MG1 and MG2.

Hereinafter, another example of a method of manufacturing a semiconductor device according to the present inventive concept will be described with reference to FIGS. 1, 2, 4 to 7, and 10A to 16.

Figure 14:
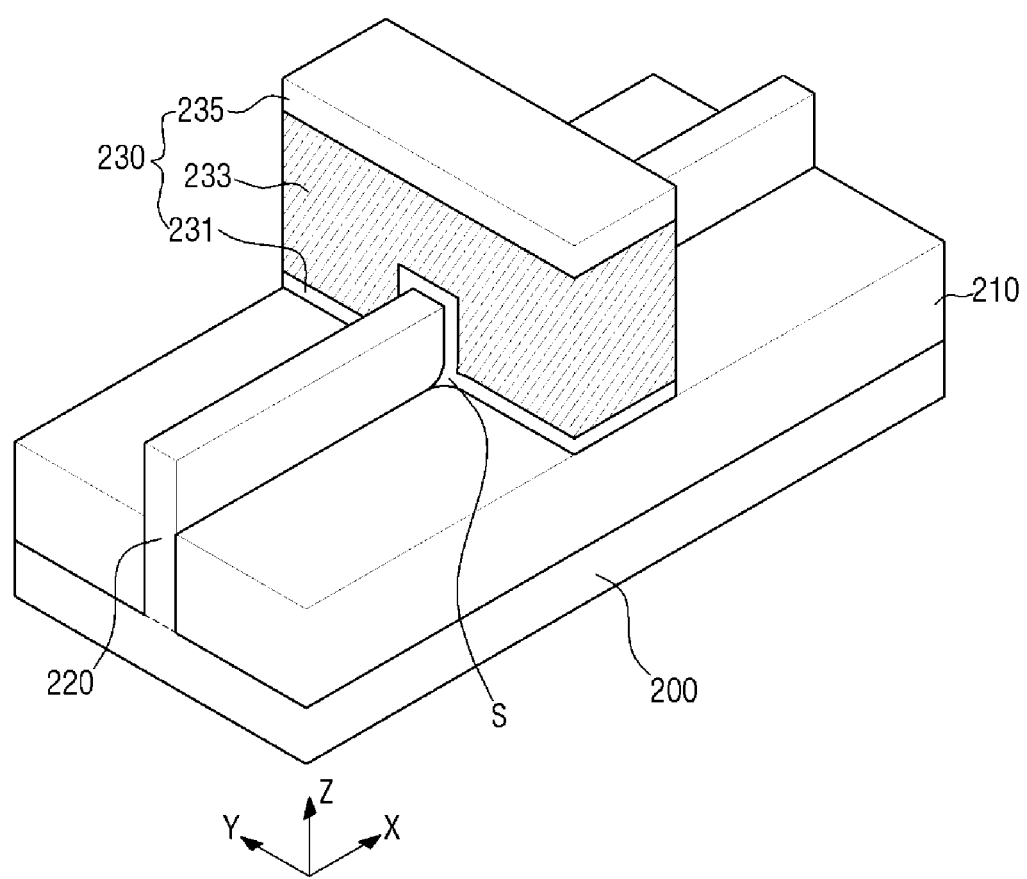

FIG. 14 shows a dummy gate structure 230 intersecting active fin 220 of a type as shown in and described with reference to FIG. 2.

The dummy gate structure 230 may include a dummy silicon oxide layer 231, a dummy gate electrode 233, and a hard mask 235. A lowermost portion of the dummy gate structure 230, e.g., the oxide layer 231, may include a skirt (S).

The skirt (S) may thus be formed in a region at which the dummy gate structure 230 is adjacent to the active fin 220. That is, the dummy gate structure 230 may include the skirt (S) directly adjacent to the active fin 220. The skirt (S) may be curved. In this case, the skirt (S) may cover one part of a seam, along which the upper surface of the field insulating layer 210 is in contact with the active fin 220, and may expose the other part thereof. More specifically, in this example the dummy gate structure 230 is formed such that the skirt (s) has a curved profile in a vertical plane extending in the first direction (X), and such that the skirt extends atop one part only of an edge of the field insulating layer 210 at which the field insulating layer 210 contacts the active fin 220.

Figure 15:
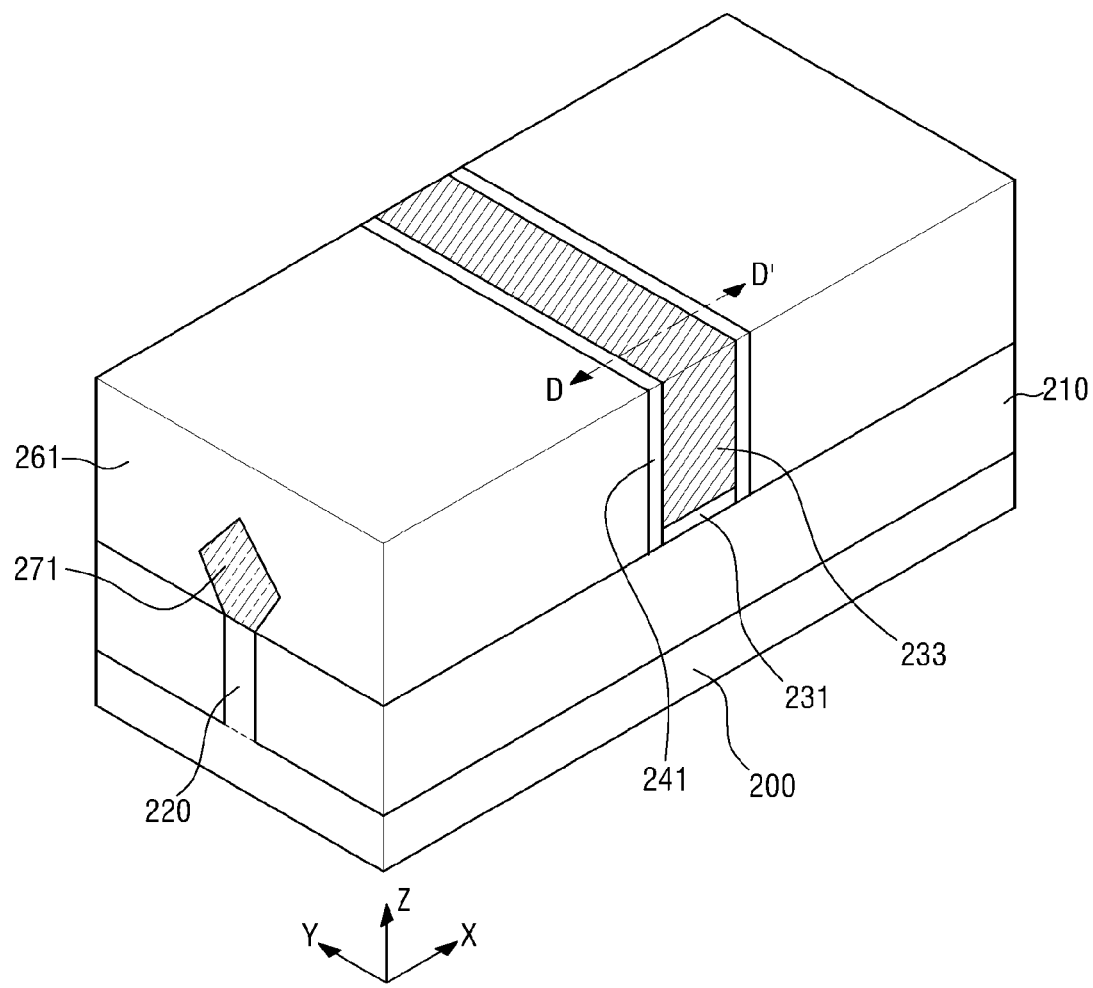

Referring to FIG. 15, a gate spacer 241 may formed through the processes shown in and described with reference to FIGS. 4 and 5. The gate spacer may have any of the shapes shown in and described with reference to FIGS. 6A and 6B.

Subsequently, a semiconductor pattern 271 and an interlayer insulating film 261 may be formed through the processes shown in and described with reference to FIG. 7.

The semiconductor pattern 271 may constitute the source and drain of a transistor and may be an elevated source and drain.

The interlayer insulating film 261 may be planarized until the upper surface of the hard mask 235 is exposed. Alternatively, the interlayer insulating film 261 may be planarized until the upper surface of the dummy gate electrode 233 is exposed. In this case, the hard mask 235 may be removed together with the interlayer insulating film 261.

The dummy silicon oxide layer 231 and the dummy gate electrode 233 may be removed in order to form a replacement gate electrode. Here, the removal of the dummy gate electrode 233 may be performed by a wet etching process.

In the wet etching process, the dummy gate electrode 233 can be removed without removing the gate spacer 241.

Figure 16:
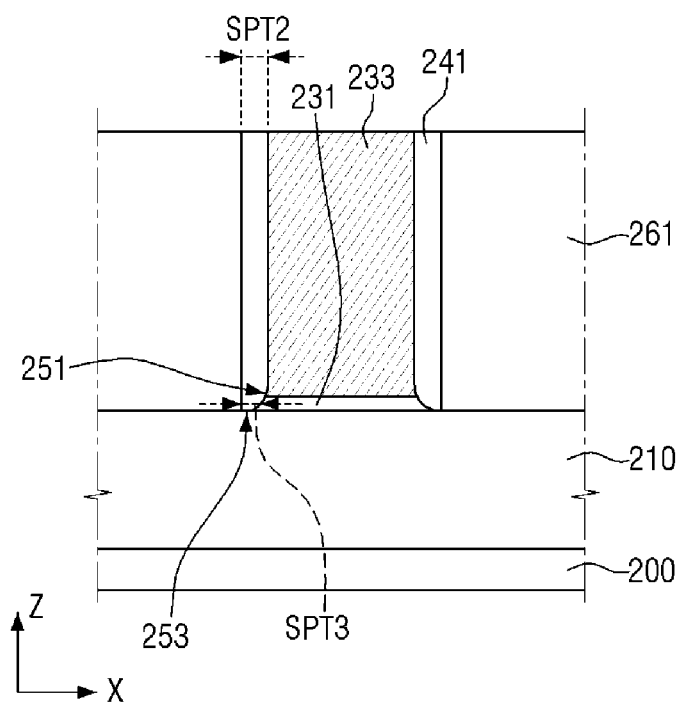

Referring to FIG. 16, when the dummy gate structure 230 includes the skirt (S), the thickness of the upper portion of the gate spacer 241 may be different from the thickness of the lower portion of the gate spacer 241.

The upper portion of the gate spacer 241 may be that portion formed on the sides of the upper portion of the dummy gate electrode 233. The lower portion of the gate spacer 241 may be that portion formed on the sides of the skirt (S).

The thickness of the upper portion of the gate spacer 241 (SPT2) may be the thickness of the gate spacer 241 in the first direction (X) as taken at the uppermost surface of the dummy gate electrode 233.

The thickness of the lower portion of the gate spacer 241 (SPT3) may be the average value of the thickness of the gate spacer 241 in the first direction (X) as taken at the top of the skirt (S) 251 and the thickness of the gate spacer 241 in the first direction (X) as taken an interface 253 between the gate spacer 241 and the field insulating layer 210.

The thickness of the lower portion of the gate spacer 241 (SPT3) is smaller than the thickness of the upper portion of the gate spacer 241 (SPT2) because of the skirt (S).

The dummy gate electrode 233 including the skirt (S) may be removed by a wet etching process. In this case, the wet etching process may be carried out as shown in and described with reference to FIGS. 10A to 11.

However, the thicknesses of the dummy gate electrode 233 removed during the primary etching and secondary etching portions of the cycle of the wet etching process shown in and described with reference to FIG. 11 may be between 1 and about 6.5 times or less SPT4, wherein SPT4 is the average value of the thickness of the upper portion of the gate spacer 241 (SPT2) and the thickness of the lower portion of the gate spacer 241 (SPT3).

Subsequently, the dummy silicon oxide layer 231 and the dummy gate electrode 233 are removed through the processes shown in and described with reference to FIGS. 12 and 13, so as to form the gate insulating layer 181 and the replacement gate electrode 183.

Hereinafter, effects of the present inventive concept will be described with reference to FIGS. 10A to 11 and 17 to 19B.

Figure 17:
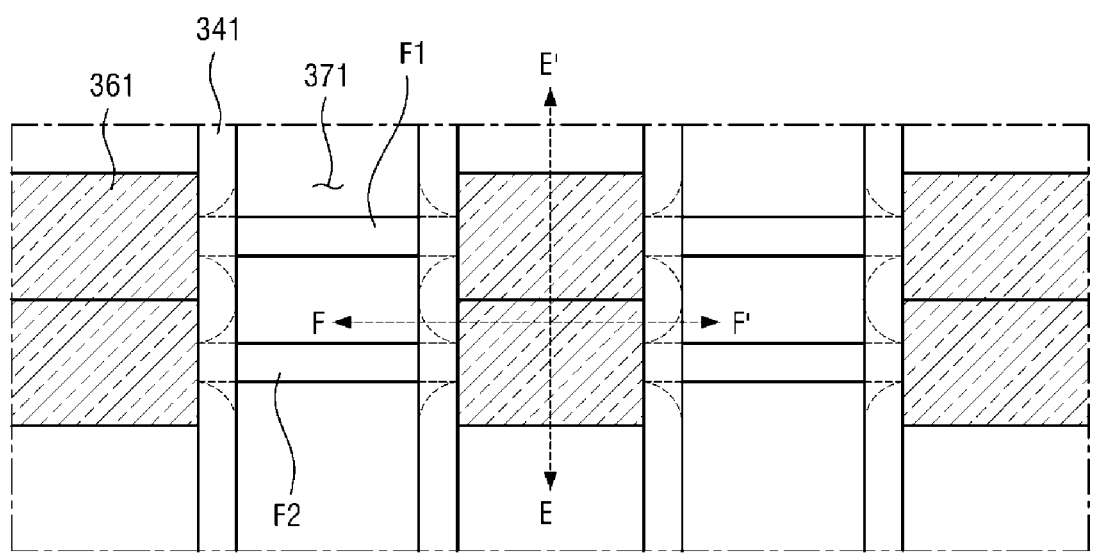
FIG. 17 is a plan view of a semiconductor device for explaining an effect of the present inventive concept.

For reference, FIG. 17 shows the appearance of a semiconductor device after removing the dummy gate electrode, as shown in FIG. 12. For ease of illustration and understanding, in FIGS. 17 to 19B, an interlayer insulating film is not shown.

Figure 18:
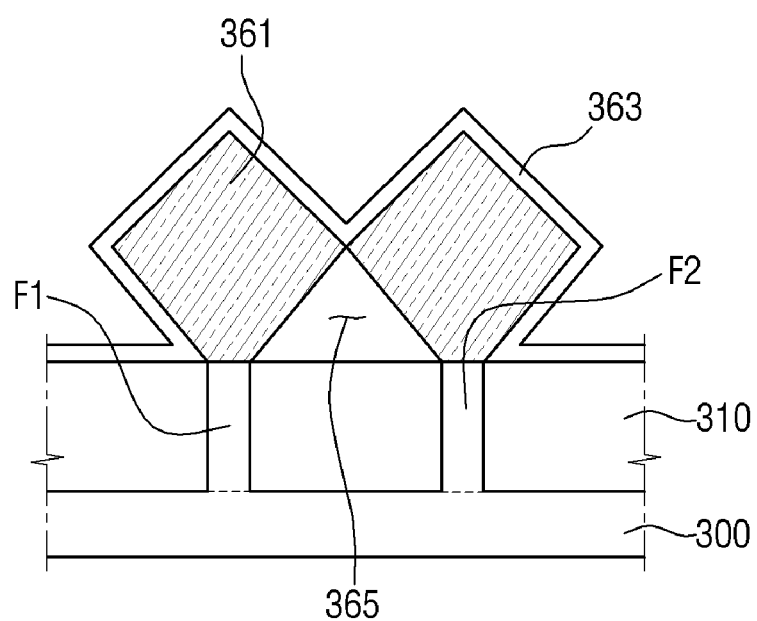
FIG. 18 is a cross-sectional view taken along line E-E' of FIG. 17.
Figure 19A:
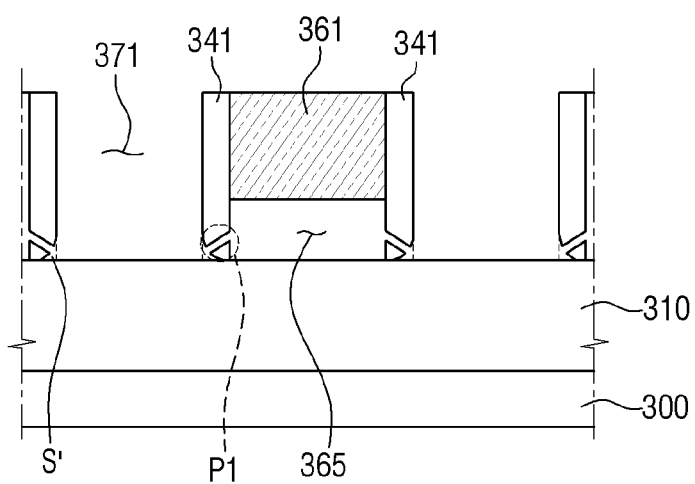
FIGS. 19A and 19B are cross-sectional views taken along the line F-F' of FIG. 17 with FIG. 19A illustrating a comparative example and FIG. 19B illustrating an example according to the inventive concept.

Referring to FIGS. 17, 18, and 19A, elevated source and drains 361 meet each other to form a void (365). For instance, as adjacent ones of elevated source and drains 361 are grown and become larger, they can meet each other and form void 365 thereunder.

A blocking layer 363 may be conformally formed on the elevated source and drains 361 and the field insulating layer 310. The blocking layer 363 may comprise an etch-resistant material. The blocking layer 363 may prevent the elevated source and drains 361 and the active fins (F1 and F2) from being etched.

The blocking layer (363) may not be formed on the elevated source and drain 361 and the field insulating layer 310, which are adjacent to the void 365.

A trench 371 may include a region (S') from which the skirt shown in FIG. 14 has been removed.

In the procedure of forming the trench 371, a pin-hole (P1) may be formed in a gate spacer 341. The penetration pin-hole (P1) may extend from the trench 371 to the void 365. Specifically, when the trench 371 is formed through a wet etching process, the wet etchant may permeate the gate spacer 341 and eventually form the pin-hole (P1) in the gate spacer 341. When the dummy gate electrode 233 includes the skirt (S in FIG. 14), the thin portion of the gate spacer 341 may be especially vulnerable to the wet etchant. In this case, the pin-hole (P1) may be formed in the thin portion of the gate spacer 341. In the case in which the pin-hole (P1) reaches the void, the wet etchant may flow into the void 365 through the pin-hole (P1). The elevated source and drain 361, whose portion adjacent to the void 365 is not provided with the blocking layer 363, may be etched by the wet etchant having passed through the penetration pin-hole (P1).

Accordingly, when a gate filling the trench 371 is formed later, a short circuit may occur between the gate and the source and drain.

Figure 19B:
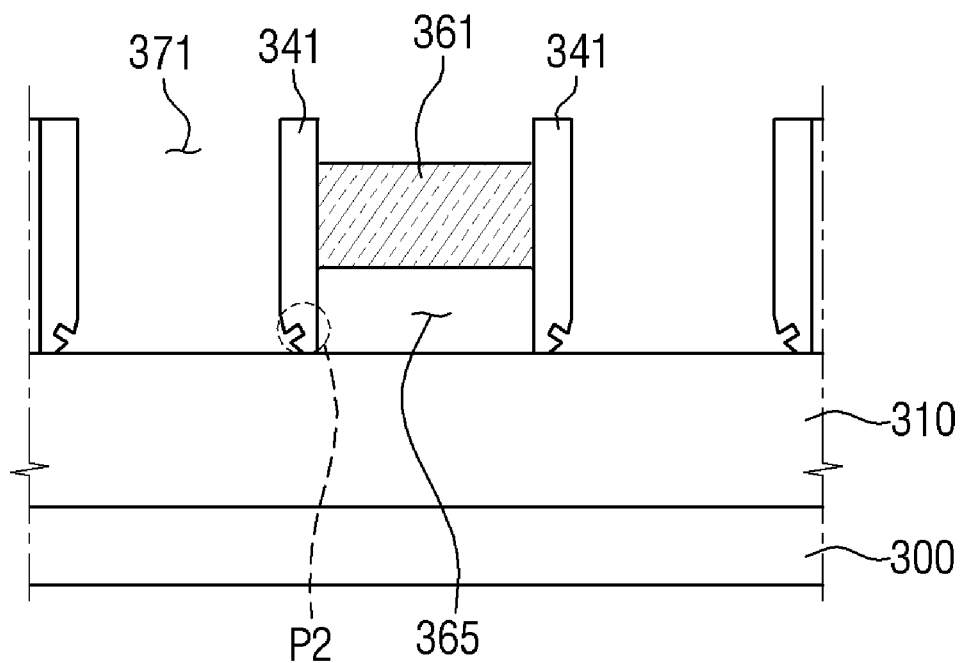

According to methods of manufacturing a semiconductor device according to the present inventive concept, in the wet etching process of forming the trench 371, a pin-hole is not formed in the gate spacer 341 or, as shown in FIG. 19B, even when a pin-hole (P2) is formed in the gate spacer 341, the pin-hole (P2) does not pass through the gate spacer 341 to the void 371.

Thus, a short circuit is prevented between the gate and the source and drain when the gate is formed in the trench 371.

In examples of a method of manufacturing a semiconductor device according to the present inventive concept, the thickness of the gate spacer removed during each cycle of a wet etching process may be predetermined with respect to, i.e., a value based on at least one measure of, the thickness of the gate spacer 341. The wet etching process may be controlled, therefore, to etch away a certain amount of the dummy gate electrode 233 (referred to hereinafter as the "wet etching amount") per unit time.

Table 1 below shows experimental results of confirming whether a penetration pin-hole (P1) is formed in the gate spacer 341, for different wet etching amounts.

TABLE 1

Whether penetration pin-hole is formed in gate spacer
(AU: arbitrary unit) (gate spacer thickness = 100 AU)

| Wet etching amount (unit: AU) | Whether penetration pin-hole is formed in gate spacer |
|---|---|
| 100 | X |
| 200 | X |
| 330 | X |
| 480 | X |
| 510 | X |
| 650 | X |
| 660 | ○ |
| 700 | ○ |

Referring to Table 1, in the case in which the thickness of the gate spacer 341 is 100 AU, when the wet etching amount is more than 650 AU, the penetration pin-hole (P1) was formed in the gate spacer 341. That is, when the wet etching amount exceeds about 6.5 times the thickness of the gate spacer 341, there is a tendency for the penetration pin-hole (P1) to be formed in the gate spacer 341.

Thus, in some methods of manufacturing a semiconductor device according to the present inventive concept, the wet etching process is controlled so that the wet etching amount (amount etched away per cycle) is between 1 and 6.5 times the thickness of the gate spacer to prevent the forming of a pin-hole through the gate spacer. Based on the relative thicknesses of the dummy gate electrode and gate spacer, part of the dummy gate electrode remains after at least one cycle of the wet etching process. That is, several cycles of the wet etching process are required to completely remove the dummy gate electrode. In this case, in an example of the method of manufacturing a semiconductor device according to the present inventive concept, each cycle wet etching process includes a rinsing process. Through the rinsing process, at least a part of the etchant having permeated into the gate spacer can be removed. As a result, as mentioned above, a pin-hole will not be formed through the gate spacer even though the dummy gate electrode has been completely removed using a wet etchant. Therefore, the reliability and a high performance of the semiconductor device are ensured.

Figure 20:
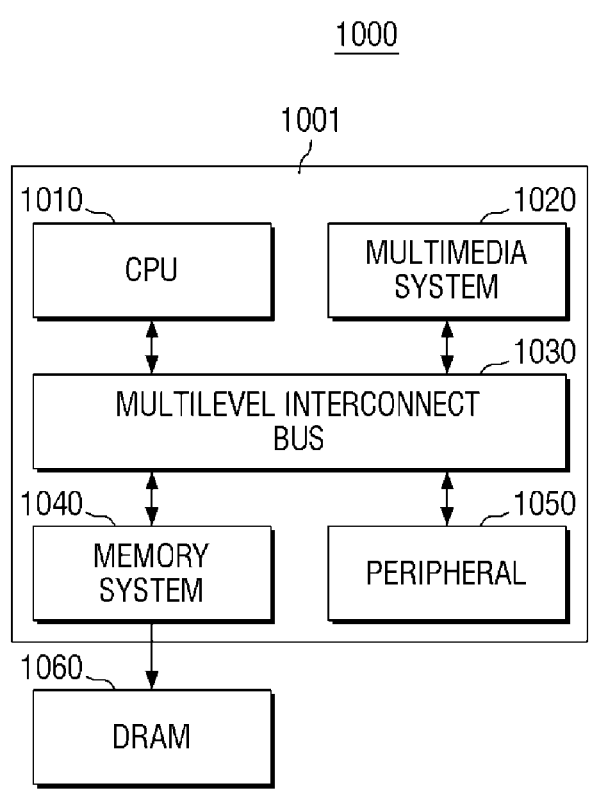
FIG. 20 is a block diagram of an SoC system including a semiconductor device manufactured according to the present inventive concept.

FIG. 20 is a block diagram of an SoC system including a semiconductor device manufactured by a method according to the present inventive concept.

Referring to FIG. 20, the SoC system 1000 includes an application processor 1001 and DRAM 1060.

The application processor may include a central processing unit (CPU) 1010, a multimedia system 1020, a bus 1030, a memory system 1040, and a peripheral circuit 1050.

The central processing unit (CPU) 1010 can perform the operation of driving the SoC system 1000. The central processing unit (CPU) 1010 may be constituted be a multi-core processor, i.e., a processor including a plurality of cores.

The multimedia system 1020 can be used to perform various multimedia functions in the SoC system 1000. This multimedia system 1020 may include a 3D engine module, a video codec, a display system, a camera system, a post-processor, and the like.

The bus 1030 can be used to allow the central processing unit (CPU) 1010, the multimedia system 1020, the memory system 1040 and the peripheral circuit 1050 to communicate with each other. The bus 1030 may have a multilayered structure. Specifically, examples of the bus may include, but are not limited to, a multilayer advanced high-performance bus (AHB) and a multilayer advanced extensible interface (AXI).

The memory system 1040 can provide an environment necessary for the application processor 1001 connected with external memory (for example, DRAM 1060) to perform a high-speed operation. The memory system 1040 may include a separate controller (for example, a DRAM controller) for controlling the external memory (for example, DRAM 1060).

The peripheral circuit 1050 can provide an environment necessary for the SoC system 1000 to easily connect with an external device (for example, a main board). Therefore, the peripheral circuit 1050 may include various interfaces enabling the external devices connected to the SoC system 1000 to be compatible with each other.

The DRAM 1060 can function as operation memory necessary for operating the application processor 1001. The DRAM 1060 may be disposed outside of the application processor 1001, as shown in FIG. 20. Specifically, the DRAM 1060 may be packaged with the application processor 1001 in the form of PoP (Package on Package).

At least one of these components of the SoC system 1000 may be manufactured by a method according to the present inventive concept.

Figure 21:
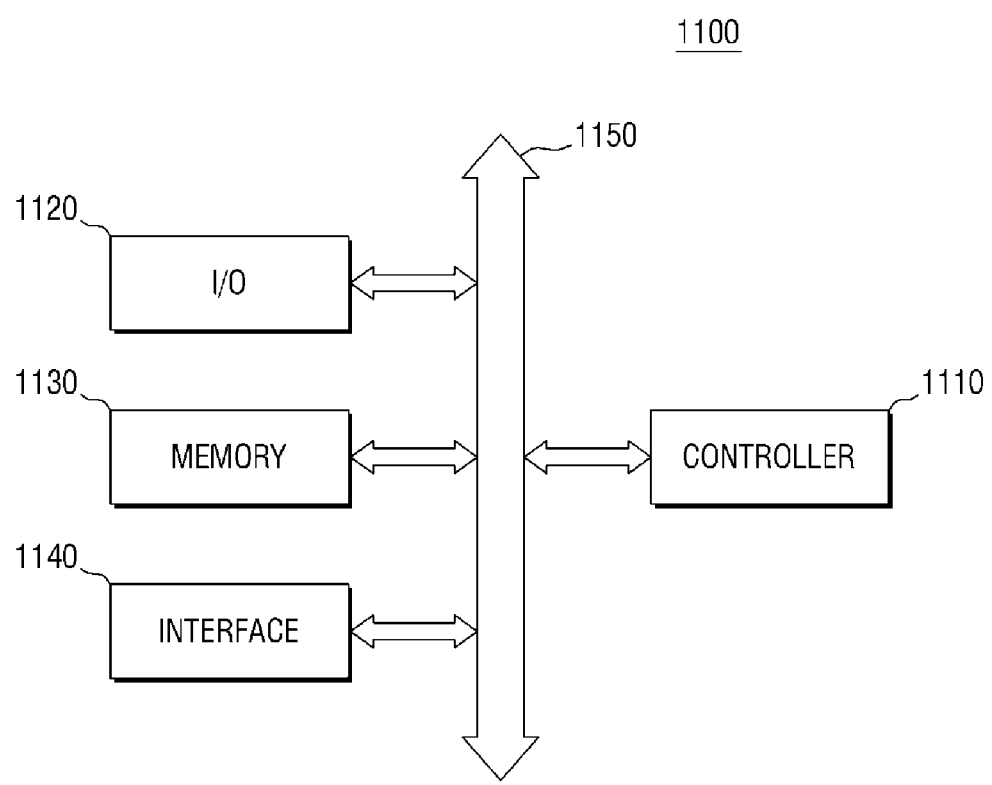
FIG. 21 is a block diagram of an electronic system including a semiconductor device manufactured according to the present inventive concept.

FIG. 21 is a block diagram of an electronic system including a semiconductor device manufactured by a method of manufacturing a semiconductor device according to the present inventive concept.

Referring to FIG. 21, the electronic system 1100 according to this example includes a controller 1110, an input and output device (I/O) 1120, a memory device 1130, an interface 1140, and a bus 1150. The controller 1110, the input and output device 1120, the memory device 1130 and/or the interface 1140 may be connected to each other through the bus 1150. The bus 1150 functions as a path for data transmission.

The controller 1110 includes at least one of a microprocessor, a digital signal processor, a microcontroller, and a logic element having a similar function to that of the above-mentioned elements. The input and output device 1120 includes a keypad, a keyboard, a display, and the like. The memory device 1130 can store data and/or commands or the like. The interface 1140 functions to transmit data to a communication network or receive data from the communication network. The interface 1140 may be embodied in a wired or wireless manner. For example, the interface 1140 may include an antenna, a wired and wireless transceiver or the like.

Although not shown in FIG. 21, the electronic system 1100 may further include a high-speed DRAM (dynamic random access memory) and/or SRAM (static random access memory) or the like as operation memory for improving the operation of the controller 1110.

Furthermore, a semiconductor device manufactured according to the present inventive concept may be provided in the memory device 1130, or may be provided as a part of the controller 1110, the input and output device (I/O) 1120, or the like.

The electronic system 1100 may be applied to a personal digital assistant (PDA), a portable computer, a web tablet, a wireless phone, a mobile phone, a digital music player, a memory card, or any other electronic device capable of transmitting and/or receiving data in a wireless environment.

Figure 22:
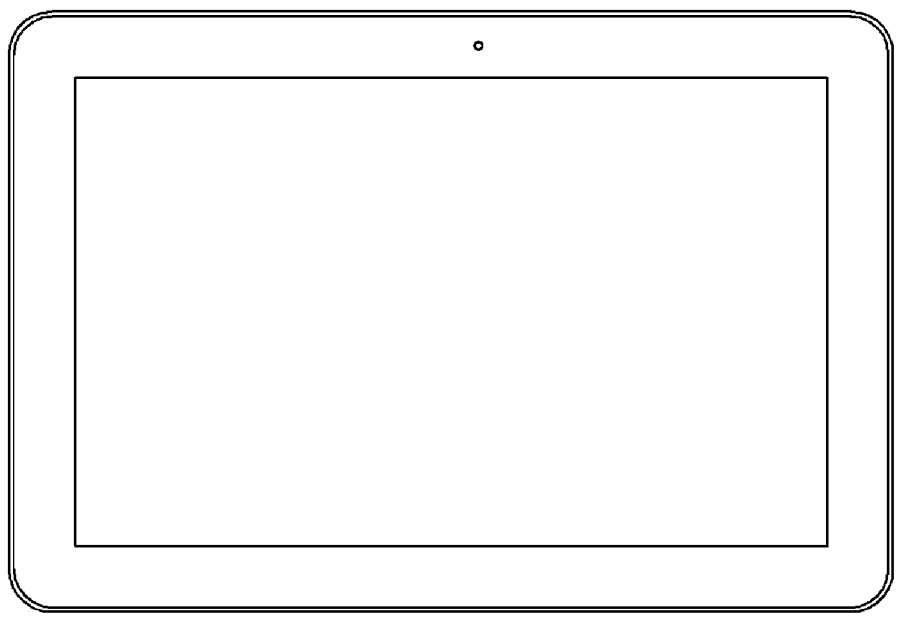
FIG. 22 is a plan view of a tablet PC including a semiconductor device manufactured according to the present inventive concept.
Figure 23:
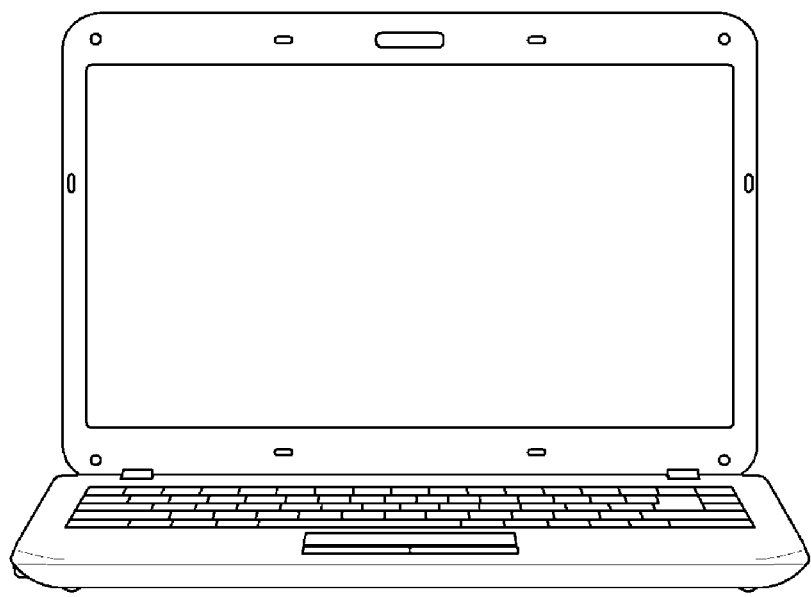
FIG. 23 is a front view of a notebook computer including a semiconductor device manufactured according to the present inventive concept.
Figure 24:
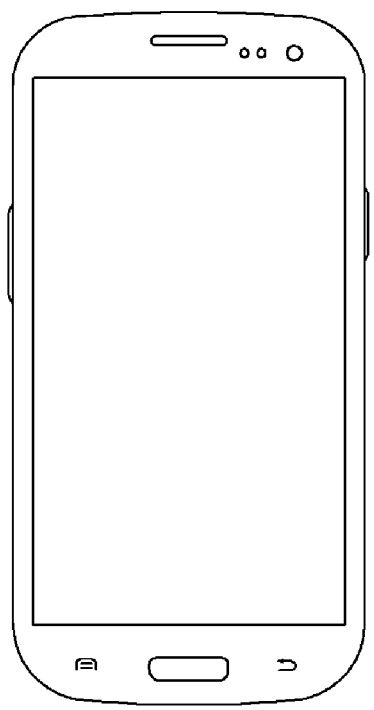
FIG. 24 is a plan view of a smart phone including a semiconductor device manufactured according to the present inventive concept.

FIGS. 22 to 24 show examples of electronic products having integrated circuits that may comprise semiconductor devices manufactured according to the present inventive concept.

FIG. 22 shows a tablet PC 1200, FIG. 23 shows a notebook computer 1300, and FIG. 14 shows a smart phone 1400. Moreover, those skilled in this art will readily understand from these examples that semiconductor devices manufactured by methods according to the present inventive concept can be used in integrated circuits of other devices which are not described above.

That is, semiconductor devices manufactured according to the present inventive concept may be employed in a computer, an ultra mobile PC (UMPC), a workstation, a notebook, a personal digital assistant (PDA), a laptop computer, a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, etc.

Although the present inventive concept has been particularly shown and described with reference to various examples thereof, it will be understood by those of ordinary skill in the art that various changes in form and details may be made to these examples without departing from the spirit and scope of the present inventive concept as defined by the following claims. Therefore, the above-described examples should be considered in all respects as illustrative and not restrictive, reference being made to the appended claims rather than the foregoing description.

What is claimed is:

1. A method of manufacturing a semiconductor device, comprising:
   forming an active fin extending longitudinally along a surface of a substrate in a first direction;
   forming a field insulating layer on the substrate, the field insulating layer covering a part of the active fin;
   forming a dummy gate structure comprising a dummy gate electrode on the field insulating layer and the active fin, the dummy gate electrode extending longitudinally in a second direction different from the first direction;
   forming a spacer on sides of the dummy gate electrode;
   removing the dummy gate electrode by performing a wet etching process including:
   a primary etch process of etching away a first thickness of the dummy gate electrode using an etchant,
   rinsing the dummy gate electrode using a rinse solution after the primary etching process,
   a secondary etch process of etching away a second thickness of the dummy gate electrode using an etchant after the rinsing, and
   deriving a value representative of at least one thickness of the spacer as taken in the first direction, and wherein the first thickness is substantially equal to 1 to 6.5 times said value,
   wherein a composition of the rinse solution is different from that of the etchant used in each of the primary and secondary etch processes such that the rinsing of the dummy gate electrode is a process discrete from each of the primary etch process and the secondary etch process.

2. The method of claim 1, wherein the etch processes both comprise etching the dummy gate electrode with a solution of ammonia.

3. The method of claim 1, wherein the removing of the dummy gate electrode further comprises treating a surface of the dummy gate electrode using a cleaning solution before the primary etch process.

4. The method of claim 1, wherein the second thickness is substantially equal 1 to 6.5 times said value.

5. The method of claim 1, wherein the dummy gate structure is formed so as to have a skirt at a lower portion thereof, the skirt having a curved profile in a vertical plane extending in the first direction, the skirt extending atop one part of an edge of the field insulating layer at which the field insulating layer contacts the active fin, and the skirt exposing another part of the edge.

6. The method of claim 5, wherein the spacer is formed such that an upper portion thereof is formed over sides of the upper portion of the dummy gate electrode and a lower portion formed over the skirt such that a thickness of the lower portion of the spacer in the first direction varies.

7. The method of claim 6, wherein said first thickness is substantially equal to a value of 1 to 6.5 times an average of first and second values, the first value being equal to a thickness of the upper portion of the spacer in the first direction, and the second value being an average of the thickness of the spacer in the first direction at an uppermost portion of the skirt where the profile of the skirt begins to curve and the thickness of the spacer in the first direction at a boundary between the dummy gate structure and the field insulating layer.

8. The method of claim 6, wherein said second thickness is substantially equal to a value of 1 to 6.5 times an average of first and second values, the first value being equal to a thickness of the upper portion of the spacer in the first direction, and the second value being an average of the thickness of the spacer in the first direction at an uppermost portion of the skirt where the profile of the skirt begins to curve and the thickness of the spacer in the first direction at a boundary between the dummy gate structure and the field insulating layer.

9. The method of claim 1, wherein the rinsing of the dummy gate electrode comprises removing at least some of the etchant that has permeated into the spacer.

10. A method of manufacturing a semiconductor device, comprising:
  forming an active fin extending longitudinally along a surface of a substrate in a first direction;
  forming a field insulating layer on the substrate, the field insulating layer covering a part of the active fin;
  forming a dummy gate structure comprising a dummy gate electrode on the field insulating layer and the active fin, the dummy gate electrode extending longitudinally in a second direction different from the first direction;
  forming a spacer on sides of the dummy gate electrode;
  forming a source and drain on the active fin; and
  removing the dummy gate electrode,
  wherein the removing of the dummy gate electrode comprises predetermining a value based on at least one thickness of the spacer in the first direction, and
  etching away thicknesses of the dummy gate electrode with wet etchant in a series of discrete etches, respectively, a first of the thicknesses being substantially equal to 1 to 6.5 times said value.

11. The method of claim 10, wherein the removing of the dummy gate electrode further comprises treating a surface of the dummy gate electrode using a cleaning solution before a first one of the thicknesses of the dummy gate electrode is removed by the etching.

12. The method of claim 10, wherein the removing of the dummy gate electrode further comprises rinsing the dummy gate electrode after the first of the thicknesses of the dummy gate electrode is removed by the wet etches.

13. The method of claim 12, wherein the rinsing removes at least some of the wet etchant that has permeated the spacer.

14. The method of claim 12, wherein the second of the thicknesses of the dummy gate electrode removed by the wet etches is substantially equal to 1 to 6.5 times said value.

15. A method of manufacturing a semiconductor device, comprising:
  forming a field insulating layer on a surface of a substrate, and forming at least one active fin, the field insulating layer covering a lower part of each said at least one active fin;
  forming a dummy gate structure comprising a dummy gate electrode on the field insulating layer and extending across an upper part of each said at least one active fin;
  forming a spacer on sides of the dummy gate electrode such that the spacer also extends across the an upper part of each said at least one active fin;
  subsequently etching away the dummy gate electrode using at least one wet etchant such that a trench is formed in a region vacated by the dummy gate electrode; and
  after each of at least one portion of the dummy gate electrode has been etched away, rinsing a remaining portion of the dummy gate electrode with a rinsing solution that does not etch a material of the dummy gate electrode, whereby sides of the spacer facing the dummy gate electrode are also rinsed with the rinsing solution;
  forming a gate electrode in the trench, and
  deriving a value representative of at least one thickness of the spacer as taken in a first direction,
  wherein a thickness of the each of at least one portion of the dummy gate electrode is substantially equal to 1 to 6.5 times the value.

16. The method of claim 15, wherein the spacer is formed of at least one material selected from the group consisting of silicon nitride (SiN), silicon oxynitride (SiON), silicon oxide ($SiO_2$), silicon oxycarbonitride (SiOCN), and silicon carbonitride (SiCN),
  the dummy gate electrode is formed of polysilicon, and
  the at least one wet etchant comprises ammonia ($NH_3$).

17. The method of claim 16, wherein the rinsing solution is deionized water.

18. The method of claim 15, further comprising cleaning a surface of the dummy gate electrode before any of the dummy gate electrode is etched away using the at least one wet etchant.

19. The method of claim 15, wherein the forming of at least one active fin comprises forming a plurality of active fins parallel to one another, and
  further comprising forming elevated source and drains on the active fins, respectively,
  wherein each of the elevated source and drains contact the spacer, the elevated source and drain on each one of the active fins contacts the elevated source and drain on another of the active fins adjacent to said one of the active fins, and a void is left beneath the elevated source and drains that contact each other, the void exposing a bottom portion of the spacer.

* * * * *